United States Patent
Chuang et al.

(10) Patent No.: US 8,524,570 B2
(45) Date of Patent: Sep. 3, 2013

(54) METHOD AND APPARATUS FOR IMPROVING GATE CONTACT

(75) Inventors: Harry Hak-Lay Chuang, Hsinchu (TW); Chih-Yang Yeh, Jhubei (TW); Bao-Ru Young, Zhubei (TW); Yuh-Jier Mii, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 271 days.

(21) Appl. No.: 12/890,995

(22) Filed: Sep. 27, 2010

(65) Prior Publication Data
US 2012/0074498 A1 Mar. 29, 2012

(51) Int. Cl.
*H01L 21/76* (2006.01)

(52) U.S. Cl.
USPC ............ 438/424; 257/330; 257/E21.546

(58) Field of Classification Search
USPC ............ 257/330, 331, 368, E21.546, E27.06; 438/424
See application file for complete search history.

(56) References Cited

U.S. PATENT DOCUMENTS 6,661,043 B1 * 12/2003 Huang et al. .................. 257/243
2011/0127632 A1 * 6/2011 Yang .............................. 257/506

OTHER PUBLICATIONS

Unpublished U.S. Appl. No. 12/830,107, filed Jul. 2, 2010, titled "Method and Apparatus for Improving Gate Contact".

* cited by examiner

*Primary Examiner* — Julio J Maldonado
*Assistant Examiner* — Sonya D McCall Shepard
(74) *Attorney, Agent, or Firm* — Haynes and Boone, LLP

(57) ABSTRACT

A method of fabricating a semiconductor device includes providing a substrate having a first surface, forming an isolation structure disposed partly in the substrate and having an second surface higher than the first surface by a step height, removing a portion of the isolation structure to form a recess therein having a bottom surface disposed below the first surface, and forming a contact engaging the gate structure over the recess. A different aspect involves an apparatus that includes a substrate having a first surface, an isolation structure disposed partly in the substrate and having a second surface higher than the first surface by a step height, a recess extending downwardly from the second surface, the recess having a bottom surface disposed below the first surface, a gate structure, and a contact engaging the gate structure over the recess.

13 Claims, 12 Drawing Sheets

METHOD AND APPARATUS FOR IMPROVING GATE CONTACT

BACKGROUND

The semiconductor integrated circuit (IC) industry has experienced rapid growth. Technological advances in IC materials and design have produced generations of ICs where each new generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component or line that can be created using a fabrication process) has decreased. This scaling-down process generally provides benefits by increasing production efficiency and lowering associated costs.

During the scaling trend, various materials have been used for the gate electrode and gate dielectric in field effect transistors (FET). One approach is to fabricate these devices with a metal material for the gate electrode and a high-k dielectric for the gate dielectric. However, high-k metal gate (HKMG) devices often require additional layers in the gate structure. For example, work function layers may be used to tune the work function values of the metal gates. Although these approaches have been generally adequate for their intended purposes, they have not been satisfactory in all respects. For example, each additional layer in the HKMG gate stack may reduce the thickness of the upper-most metal layer in the stack, increasing the difficulty of device fabrication. This issue is particularly relevant to analog HKMG devices, which may have thicker gate dielectric layers. Furthermore, HKMG devices may suffer from a power short circuit issue resulting from a contact etch through the gate stack.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
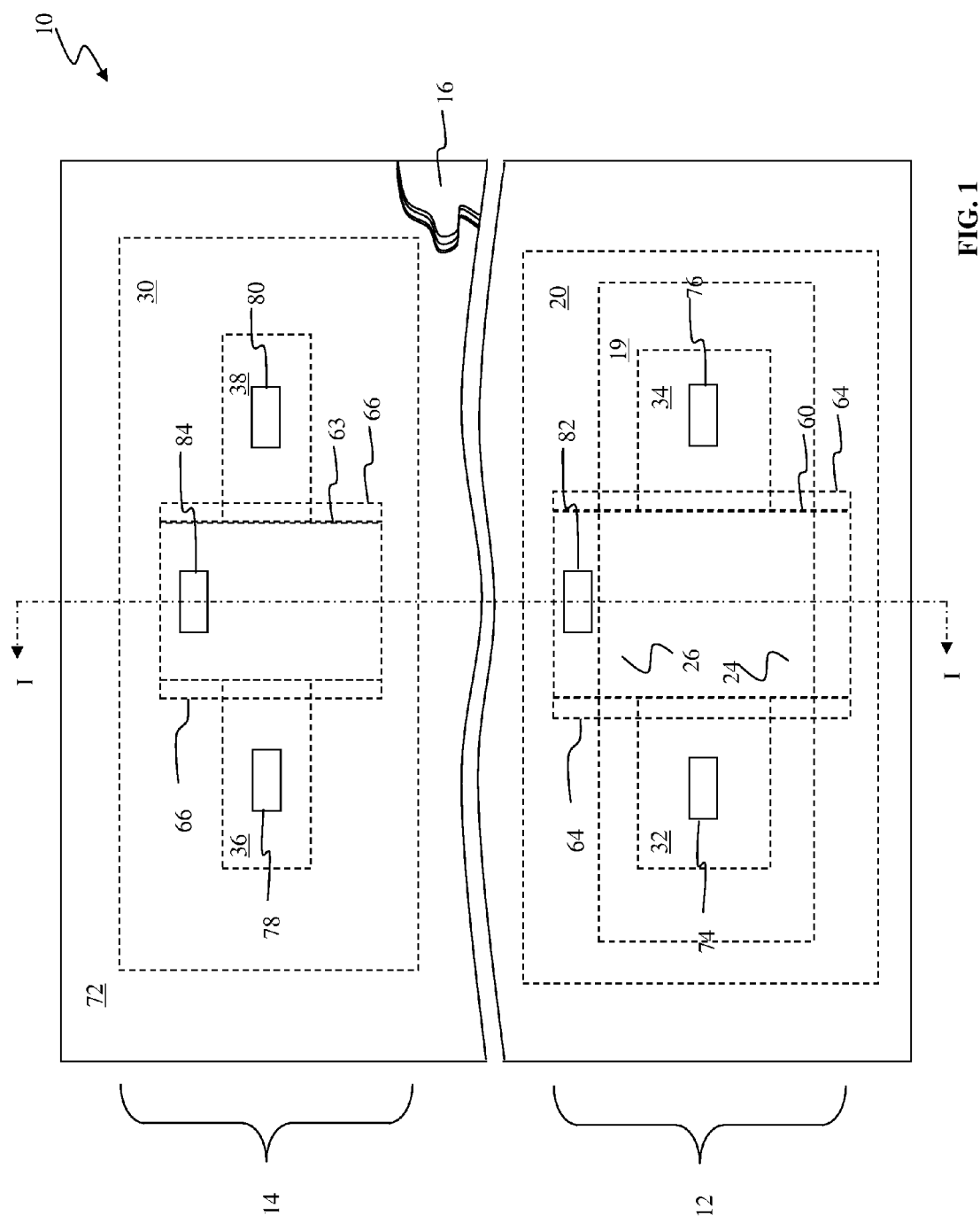
FIG. 1 is a diagrammatic fragmentary top view of a semiconductor device.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed between the first and second features, such that the first and second features may not be in direct contact.

Figure 2:
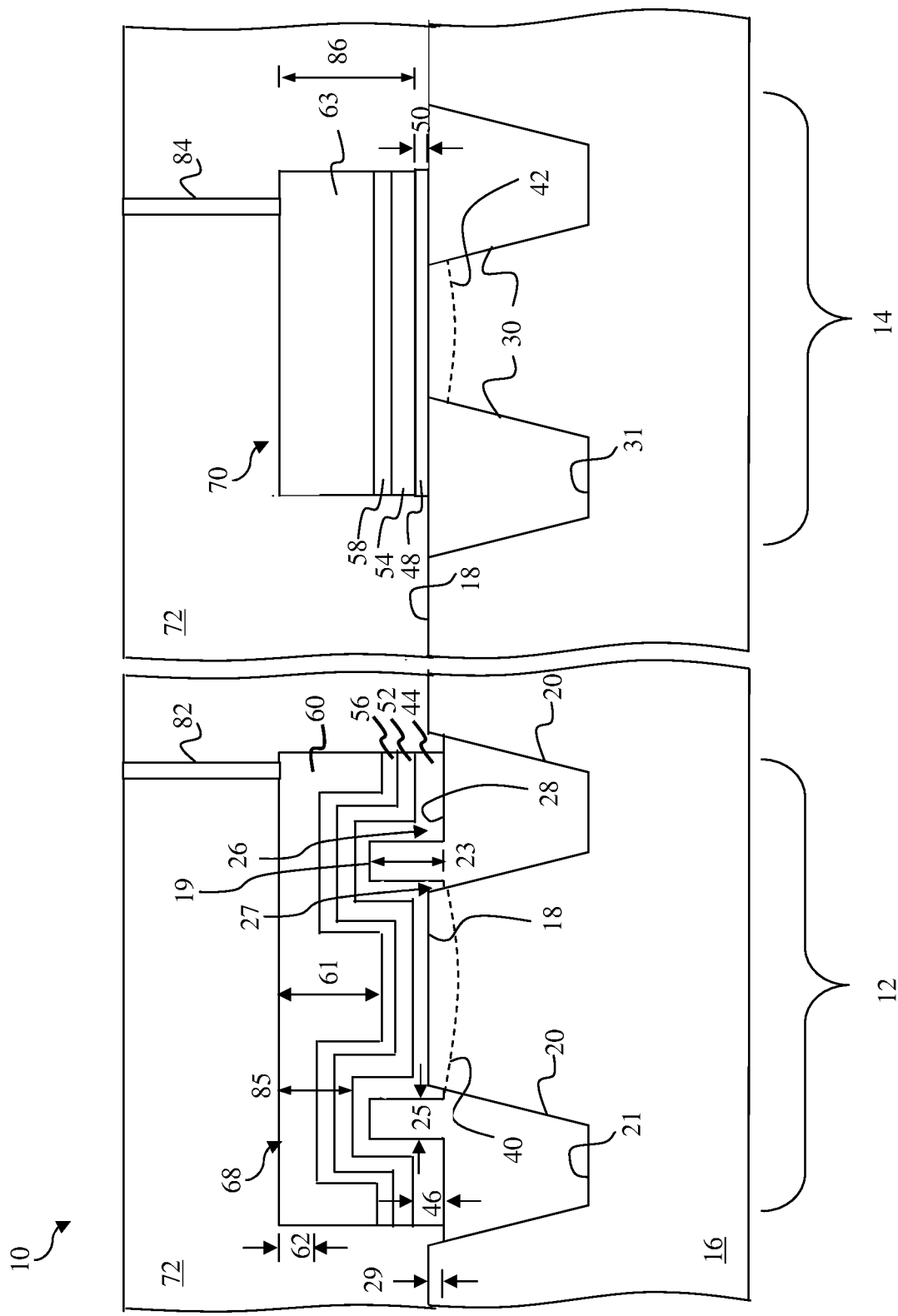
FIG. 2 is a diagrammatic fragmentary sectional side view of the semiconductor device taken along line I-I in FIG. 1.

FIG. 1 is a diagrammatic fragmentary top view of a semiconductor device 10, and FIG. 2 is a diagrammatic fragmentary sectional side view taken along line I-I in FIG. 1. The semiconductor device 10 is an integrated circuit that includes an analog device 12 and a digital device 14. In the embodiment depicted in FIGS. 1-2, the analog device 12 and the digital device 14 are metal-oxide-semiconductor field effect transistors (MOSFETs). More specifically, they are p-channel MOSFETs (pMOS transistors) utilizing high-k metal gate (HKMG) technology. The analog device may be used in an analog system such as a radio frequency (RF) device, input/output (I/O) device, or amplifier. The digital device may be used in a digital (or core) system such as a memory storage device (e.g. a static random access memory (SRAM)). Alternatively, the analog and digital devices may be other semiconductor devices of a known type such as n-channel MOSFETs. The analog device 12 and the digital device 14 are spaced from one another in the semiconductor device 10, but they may alternatively be adjacent to one another or at any other location in the integrated circuit.

The semiconductor device 10 is formed on a silicon semiconductor substrate 16. The substrate 16 has an upper surface 18. Alternatively, the semiconductor substrate could be: an elementary semiconductor including germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Isolation structure 20 is a region of dielectric material formed in a trench 21 etched into the substrate 16. In the embodiment of FIGS. 1-2, the isolation structure 20 is annular and extends around the analog device 12 to prevent electrical interference or crosstalk between this device and other devices disposed on the substrate 16. In FIG. 2, mirror images of isolation structure 20 are illustrated. The isolation structure 20 utilizes shallow trench isolation (STI) to define and electrically isolate the analog device 12. The isolation structure 20 is composed of silicon oxide in one example. However, in other alternative embodiments, the dielectric material could be silicon nitride, silicon oxynitride, other suitable materials, and/or combinations thereof. The isolation structure 20 may alternatively have a multi-layer structure such as a thermal oxide liner layer filled with silicon nitride or silicon oxide.

The isolation structure 20 has portions disposed both below and above the surface 18 of substrate 16. Isolation structure 20 includes recesses 26 and 27 separated by an isolation wall 19. A step height 23 of isolation wall 19 is between about 100 and about 300 Angstroms (Å), and a width 25 of isolation wall 19 is between about 200 and about 300 Angstroms, but the height and width of isolation wall 19 may be larger or smaller depending on manufacturing processes. Recesses 26 and 27 are defined in the portion of the isolation structure 20 that extends below the substrate surface 18. The recesses 26 and 27 are formed when sections of the isolation structure 20 are removed during manufacture. In the embodiment of FIGS. 1-2, isolation structure 20 is depicted as having two recesses 26 and 27 located opposite each other. However, certain recesses may be omitted or isolation structure 20 may have additional recesses. Furthermore, although recesses 26 is depicted as having a larger width than recess 27, the widths of recesses 26 and 27 may vary depending on the desired gate structure over the isolation structures 20. Recesses 26 and 27 each have an upwardly-facing bottom surface 28 that is disposed vertically below the substrate surface 18. Bottom surface 28 may be spaced vertically below the substrate surface 18 such that there is a non-zero step height 29 between them. The difference between step height 23 and step height 29 is the step height that the isolation structure 20 extends above the surface 18, which is greater than the step height between substrate surface 18 and bottom surface 28, or step height 29.

An isolation structure 30 extends around the digital device 14. The isolation structure 30 also utilizes shallow trench isolation (STI) to define and electrically isolate the digital device 14. In the embodiment of FIGS. 1-2, all portions of the isolation structure 30 are coplanar with or disposed below the substrate surface 18. However, depending on fabrication processes, isolation structure 30 may alternatively extend above substrate surface 18 to create a step height between the two.

The substrate 16 includes source region 32 and drain region 34, which are horizontally spaced and form parts of the analog device 12, and source region 36 and drain region 38, which are horizontally spaced and form parts of the digital device 14. One outer boundary of each of the source region 32 and drain region 34 is defined by the insulating region 20, and one outer boundary of each of the source region 36 and drain region 38 is defined by the insulating region 30. As shown, insulating region 20 includes the isolation wall 19 which further forms a boundary around each of the source region 32 and drain region 34. These source and drain regions are doped wells having a dopant implanted therein that is appropriate for the design requirements of the associated device. Here, because they are parts of pMOS transistors, source and drain regions 32, 34, 36, and 38 are p-type wells doped with p-type dopants such as boron or BF2 or combinations thereof. Alternatively, if the source and drain regions are parts of nMOS transistors, they may be n-type wells doped with n-type dopants, such as phosphorus or arsenic, or combinations thereof.

A channel region 40 is defined between the source region 32 and the drain region 34 in the substrate 16 Likewise, a channel region 42 is defined between the source region 36 and the drain region 38 in the digital device 14. The channel regions 40 and 42 are active regions in the substrate 16 in which the majority carriers (in this case, holes) flow between the source and drain regions when analog device 12 and/or digital device 14 are in a conduction mode.

The analog device 12 contains a dielectric layer 44 disposed on the substrate surface 18 and over the isolation structure 20 and channel region 40. Here, the dielectric layer 44 is composed of a high-k dielectric material, such as hafnium oxide (HfOx). Alternatively, the dielectric layer 44 may include one or more other high-k dielectrics such as hafnium silicon oxide (HfSiO) or hafnium silicon oxynitride (HfSiON), or may be composed of a material with a standard dielectric constant, such as silicon oxide. The dielectric layer 44 has a thickness 46 in a range from about 20 Å to about 200 Å, but could alternatively have some other thickness. Although the dielectric layer 44 is illustrated as a single layer in FIG. 2, it may optionally include additional layers such as an interfacial layer of silicon oxide between the substrate 18 and the remainder of the dielectric layer 44.

The digital device 14 contains a dielectric layer 48 disposed on the substrate surface 18 and over the isolation structure 30 and channel region 42. The dielectric layer 48 is composed of materials similar to the materials of dielectric layer 44, but it could alternatively be composed of different materials. However, the thickness 46 of the analog device dielectric layer 44 is approximately 1.2 to 5 times larger than a thickness 50 of the digital device dielectric layer 48. The exact ratio between the two dielectric thicknesses is related to the ratio between the respective operational voltages of the analog and digital devices. Thickness 50 is in a range from about 20 Å to about 200 Å, but could alternatively be some other thickness. A semiconductor device with both analog and digital devices having dielectric layers of different respective thicknesses, as illustrated here, is often referred to as a dual gate oxide device. Although the dielectric layer 48 is illustrated as a single layer in FIG. 2, it may optionally include additional layers such as an interfacial layer of silicon oxide between the substrate surface 18 and the remainder of the dielectric layer 48.

Barrier layers 52 and 54 (also referred to as capping layers, diffusion layers, or etch stop layers (ESL)) are respectively disposed on the dielectric layers 44 and 48 and over the channel regions 40 and 42. The barrier layers 52 and 54 are composed of tantalum nitride. Alternatively, the barrier layers may include titanium, titanium nitride, tantalum, tungsten, aluminum, TaCN, TiAlN, TaSiN, WN, other suitable materials, and/or combinations thereof. In the present embodiment, the barrier layers 52 and 54 have a thickness in a range from about 10 Å to about 200 Å, but could alternatively have some other thickness.

Work function layers 56 and 58 are respectively disposed on the barrier layers 52 and 54 and over the channel regions 40 and 42. The work function layers 56 and 58 are composed of a conductive material with a work function value suitable to the type of device in which the layer is incorporated. Here, the work function layers 56 and 58 are composed of a p-type work function material such as titanium nitride (TiN), and each have a thickness of about 10 Å to about 200 Å, but either could alternatively have some other thickness. Other p-type work function materials for a pMOS device include tungsten, tungsten nitride, or combinations thereof. Alternatively, n-type work function materials for an nMOS device include tantalum nitride, titanium aluminum, titanium aluminum nitride, or combinations thereof. In an alternative embodiment, the work function layers may be omitted from the analog and digital devices 12 and 14. Instead, the devices may be tuned to have an appropriate work function value using other known methods.

In the analog device 12, a metal fill layer 60 is disposed on the work function layer 56 and over the channel region 40. The metal fill layer 60 is composed of a conductive metal, in one example aluminum. Alternatively, the metal fill layer 60 may include copper, tungsten, titanium, other suitable materials, and/or combinations thereof. The portion of the metal fill layer 60 disposed over the recesses 26, 27 and channel region 40 has a thickness 61. The thickness 61 is in a range from about 200 Å to about 450 Å, but could alternatively have some other thickness. The portion of the metal fill layer 60 disposed over the portion of isolation structure 20 extending above the substrate surface 18 has a thickness 62 that is in a range from 0 Å to about 100 Å, but could alternatively have some other thickness. As depicted in FIG. 2, the thickness 62 is smaller than the thickness 61.

In the digital device 14, a metal fill layer 63 is disposed over the work function layer 58 and over the channel region 42. The metal fill layer 63 is composed of materials similar to the metal fill layer 60, but it could alternatively be composed of different materials. However, unlike metal fill layer 60, the metal fill layer 63 has an approximately uniform thickness in a range from about 200 Å to about 450 Å throughout. This is because, in the current embodiment, there is a step height of zero between the isolation structure 30 and the substrate surface 18.

Two gate spacers 64 (FIG. 1) abut each side of the dielectric layer 44, the barrier layer 52, the work function layer 56, and the metal fill layer 60, and extend the full length of each. Similarly, two gate spacers 66 (FIG. 1) abut each side of the dielectric layer 48, the barrier layer 54, the work function layer 58, and the metal fill layer 63, and extend the full length of each. The gate spacers 64 and 66 are composed of a dielectric material. Here, they are silicon nitride. Alternatively, the gate spacers may be silicon carbide, silicon oxynitride, other suitable materials, and/or combinations thereof. Also, they may each be composed of a different material.

A gate structure 68 is a part of the analog device 12 and includes the dielectric layer 44, barrier layer 52, work function layer 56, metal fill layer 60 and gate spacers 64. The gate structure 68 may alternatively contain a larger or smaller number of layers. The gate structure 68 (including its composition layers) is an elongate structure extending over the entirety of channel region 40, and in one embodiment is disposed at least over the recess 27 of the isolation structure 20. In some embodiments, the gate structure 68 is disposed at least over the isolation wall 19, and in other embodiments is disposed at least over a portion of recess 26 of the isolation structure 20. Alternatively, the gate structure 68 may be of any shape necessary for proper operation of the analog device or to accommodate other design considerations. For example, only one end of the gate structure 68 may extend over a recess in isolation structure 20. Also, the portion of the gate structure 68 over the isolation structure may have a larger width than the portion over the channel region, so as to provide a larger surface area for connection with an interconnect structure (e.g., metal-1, metal-2, vias) of the semiconductor device.

A gate structure 70 is part of the digital device 14 and includes the dielectric layer 48, the barrier layer 54, the work function layer 58, the metal fill layer 63, and the gate spacers 66. In an alternative embodiment, the gate structure 70 of the digital device may contain a larger or smaller number of layers or be a non-HKMG gate. In the latter case, the gate structure 70 might contain only the dielectric layer and an integral layer of polysilicon appropriately doped for the device type in which it is incorporated. The gate structure 70 is an elongate structure extending over the entirety of the channel region 42 and at least partially over the isolation structure 30. Alternatively, the portion of the gate structure 70 over the insulating region may have a larger width than the portion over the channel region, so as to provide a larger surface area for connection with an interconnect structure (e.g., metal-1, metal-2, vias) of the semiconductor device.

An interlayer (or inter-level) dielectric (ILD) layer 72 is formed over the substrate 16 and the gate structures 68 and 70. The ILD layer 72 is composed of silicon oxide. Alternatively, the ILD layer may include other dielectric materials such as silicon nitride, silicon oxynitride, TEOS formed oxide, phosphosilicate glass (PSG), borophosphosilicate glass (BPSG), low-k dielectric materials, other suitable dielectric materials, and/or combinations thereof. Exemplary low-k dielectric materials include fluorinated silica glass (FSG), carbon doped silicon oxide, Black Diamond® (Applied Materials of Santa Clara, Calif.), xerogel, aerogel, amorphous fluorinated carbon, parylene, BCB (bis-benzocyclobutenes), SiLK® (Dow Chemical, Midland, Mich.), polyimide, other proper materials, and/or combinations thereof. The ILD layer 72 may alternatively be a multilayer structure having multiple dielectric materials.

A source contact 74 and a drain contact 76 extend downwardly through the ILD layer 72 and respectively engage the source region 32 and the drain region 34. The contacts 74 and 76 electrically couple the analog device 12 to the non-illustrated interconnect structure of semiconductor device 10. In the embodiment of FIGS. 1-2, the source contact 74 and the drain contact 76 are each square in a top view. Alternatively, however, a larger or smaller number of contacts may engage the source and/or drain regions, and/or the contacts may be any of a variety of different shapes. In the present embodiment, the source contact 74 and drain contact 76 are composed of copper, but they could alternatively include various other suitable conductive materials, such as tungsten.

A source contact 78 and a drain contact 80 extend downwardly through the ILD layer 72 and respectively engage the source region 36 and the drain region 38, electrically coupling the digital device 14 to the interconnect structure of semiconductor device 10. The source contact 78 and the drain contact 80 are substantially identical in size, shape, and material to the source and drain contacts 74 and 76, but in alternative embodiments they may differ in size, shape and/or material.

A gate contact 82 extends downwardly through the ILD layer 72 and engages the gate structure 68 over the recess 26 in the isolation structure 20. The gate contact 82 electrically couples the analog device 12 to the interconnect structure of semiconductor device 10. In the embodiment of FIGS. 1-2, one gate contact 82 engages the gate structure 68, but a larger number of gate contacts may engage the gate structure over the recess 26. And one or more gate contacts may engage the metal fill layer over the second recess 26, instead of or in addition to engaging the metal fill layer over the first recess 26. In the present embodiment, the gate contact 82 is composed of copper, but it may alternatively include various other suitable conductive materials such as tungsten.

A gate contact 84 extends downwardly through the ILD layer 72 and engages the gate structure 70 over the isolation structure 30. The gate contact 84 electrically couples the digital device 14 to the interconnect structure of semiconductor device 10. Alternatively, additional contacts may engage the gate structure 70. In the present embodiment, the gate contact 84 is composed of copper, but it could alternatively include various other suitable conductive materials such as tungsten.

In the embodiment of FIGS. 1-2, the analog and digital devices 12 and 14 are HKMG devices. Accordingly, they each have a plurality of layers above their respective dielectric layers including barrier layers, work function layers, and metal fill layers. In the analog device 12, these additional HKMG layers extend over the recess 27, the isolation wall 19 (the portion of isolation structure 20 extending above the substrate surface 18), and a portion over the recess 26. A thickness 85 represents the combined thickness of these three layers over the portion of the isolation structure 20 extending above the substrate surface 18. In the digital device 14, the equivalent layers over the dielectric layer 50 have an approximately uniform thickness 86 throughout. Because of step height 23 and the larger thickness 46 of dielectric layer 44, the thickness 85 of the HKMG layers in the analog device 12 is significantly smaller than the thickness 86 of the equivalent layers in the digital device 14. In particular, the thickness 62 of the metal fill layer 60 in the analog device 12 is significantly smaller than the thickness of the metal fill layer 63 in the digital device 14, because of the step height 23 and thickness of dielectric layer 46.

If the isolation structure 20 lacked recesses 26, 27, the HKMG layers in the analog device 12 would have the thickness 85 over the entirety of the isolation structure 20. More importantly, the metal fill layer 60 would have the reduced thickness 62 at the point where the gate contact 82 engages the gate structure 68. When the metal fill layer 60 is thin, the gate structure 68 is in danger of being damaged when the contact hole for the gate contact 82 is etched through the ILD 72. In more detail, this contact etching process ideally opens a hole exposing only a top portion of the metal fill layer 60. However, it is difficult to control the exact depth of the etch, and a portion of the metal fill layer 60 may be etched away as well. If the metal fill layer is too thin due to a significant step height, the gate contact etch process may etch completely through the metal fill layer. And when the gate contact hole is filled, an electrical short may be created, resulting in poor device performance or non-operation. By forming the recess 26 in the isolation structure 20 beneath the gate contact, as depicted in the embodiment of FIGS. 1-2, the metal fill layer 60 has a greater thickness over recess 26 and is thus less susceptible to etch through during the contact hole etch process.

FIGS. 3-11 are diagrammatic fragmentary sectional side views showing the semiconductor device 10 of FIGS. 1-2 during various successive stages of manufacture. It should be understood that additional processes may be provided before, during, and/or after the stages illustrated in FIGS. 3-11, and that some selected processes may only be briefly described if they are well known in the art.

Figure 3:
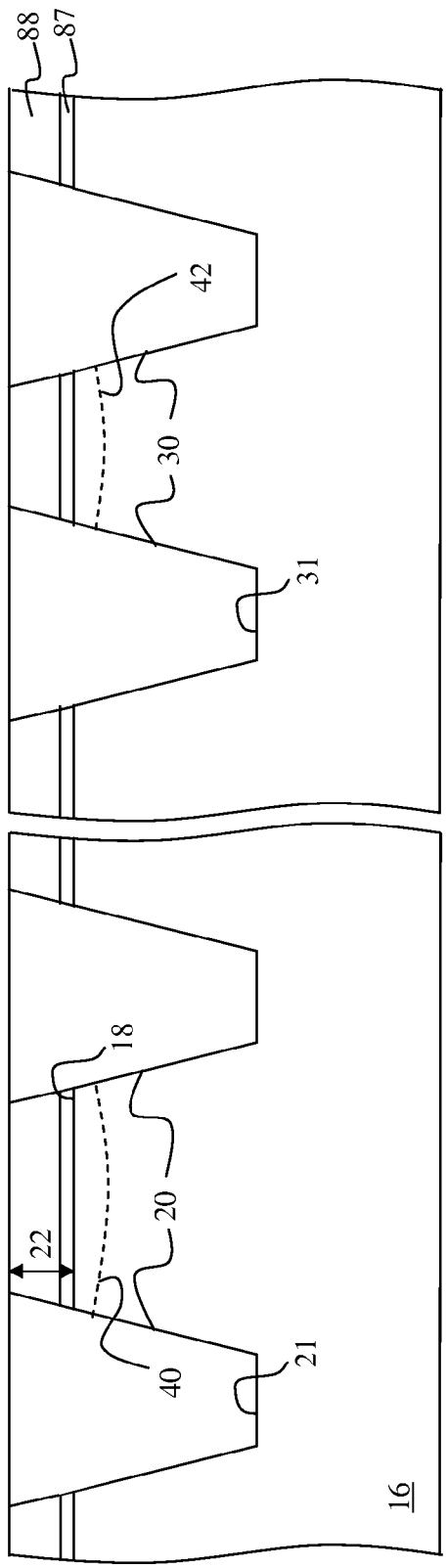
FIGS. 3-11 are diagrammatic sectional side views showing a portion of the semiconductor device of FIGS. 1-2 during various successive stages of manufacture.

Referring to FIG. 3, the silicon semiconductor substrate 16 is provided. The isolation structures 20 and 30 are formed in the substrate 16 to surround and isolate the region in which the analog and digital devices 12 and 14 will operate. The isolation structures 20 and 30 utilize shallow trench isolation (STI) technology and are formed through a series of masking and photolithography steps. In more detail, a pad layer 87 of silicon oxide is deposited on the substrate 16, followed by a mask layer 88 of silicon nitride. A non-illustrated layer of photoresist is then deposited on the mask layer 88, patterned, used to etch openings in the mask layer 88 and pad layer 87, and then removed. Trenches 21 and 31 are created in the substrate 16 by etching away portions of the substrate 16 exposed by the openings in the mask layer 88 and pad layer 87. A layer of silicon oxide is then deposited over the substrate, filling the trenches. Finally, the isolation structures 20 and 30 and the mask layer 88 are planarized. The isolation structure formation may be accomplished by any suitable process which may include dry etching, wet etching and a chemical vapor deposition process. After formation, the isolation structures 20 and 30 extend above the substrate surface 18 by the step height 22. Additionally, the channel regions 40 and 42 are identified in the substrate 16. At this point in the manufacturing process, the channel regions 40 and 42 are reference regions around which the remaining elements of the analog and digital devices 12 and 14 will be formed.

Figure 4:
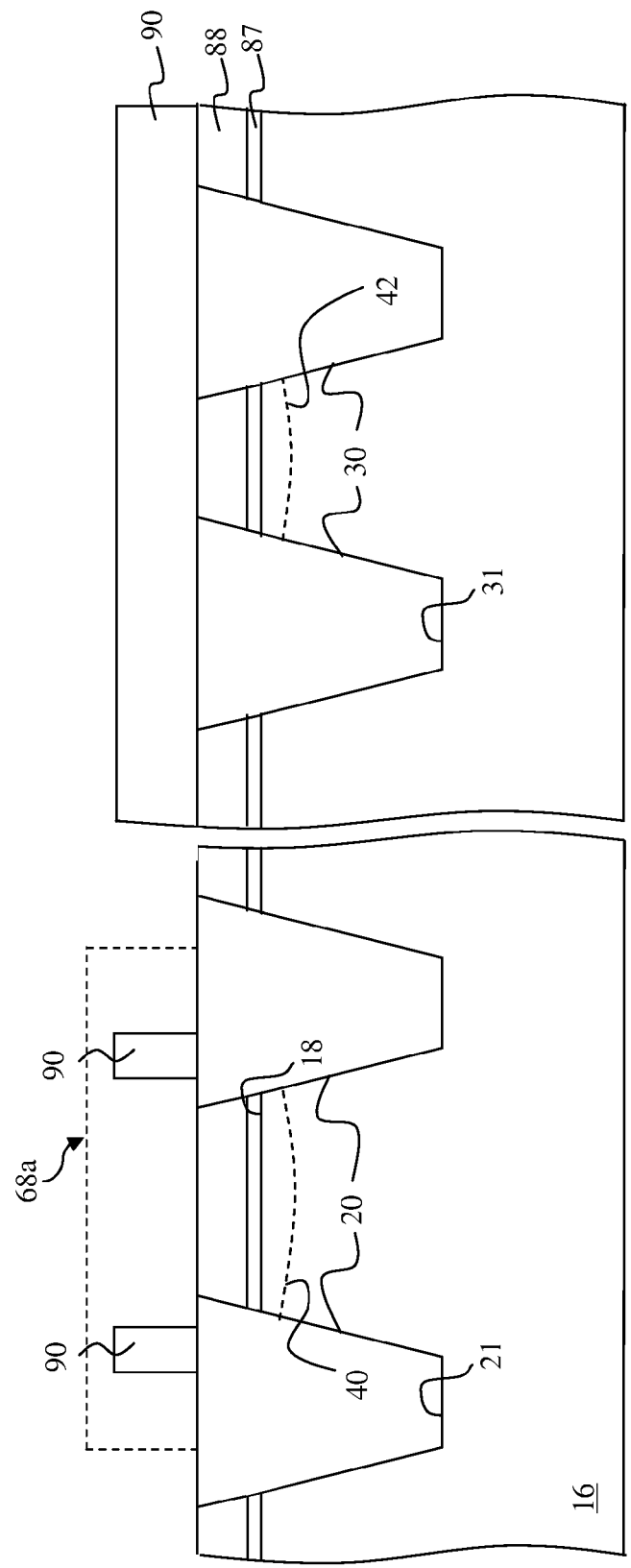

Referring now to FIG. 4, a photoresist layer 90 is deposited over the planarized isolation structures 20 and 30 and mask layer 88. The photoresist layer 90 is patterned to expose some portions of the isolation structure 20 that will be eventually covered by the gate structure 68 (depicted by the dashed lines 68a).

Figure 5:
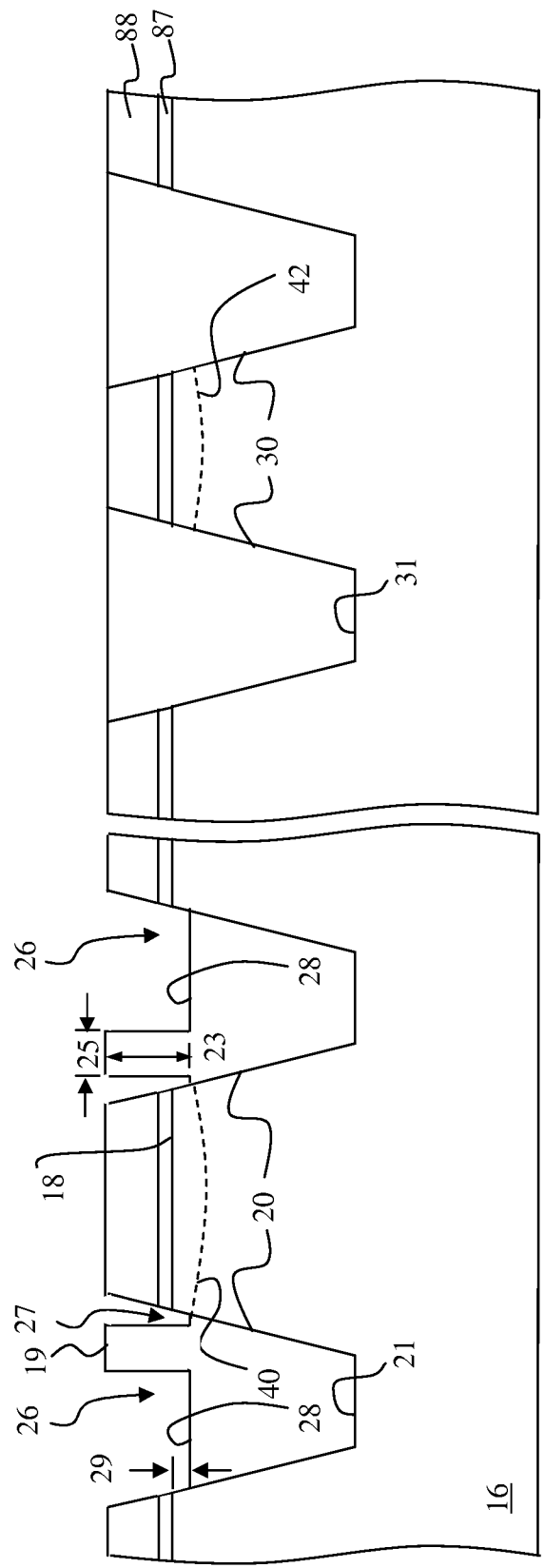

Referring now to FIG. 5, the exposed portions of the isolation structure 20 are removed by a wet etch process (or wet dip). Specifically, in one example, the semiconductor device 10 is dipped in a solution of hydrofluoric acid (HF) and the silicon oxide of the isolation structure 20 left exposed by the photoresist layer 90 is progressively removed until the recesses 26 and 27 have been formed. In one example, the HF solution is a mix of HF and water having a concentration in a range of 50:1 to 100:1. The semiconductor device is submerged in the HF solution for about 50 to 75 seconds. Alternatively, other solutions, concentrations, and submersion durations may be used for the wet etch process. Additionally, other types of etching such as a dry plasma etch may alternatively be used to remove silicon oxide from the isolation structure 20. After the etch, the recesses 26 and 27 are present in the isolation structure 20 and separated by isolation wall 19 having a height 23 and a width 25. The upperwardly-facing bottom surface 28 of the recesses 26 and 27 are disposed vertically below substrate surface 18 at a step height 29.

Figure 6:
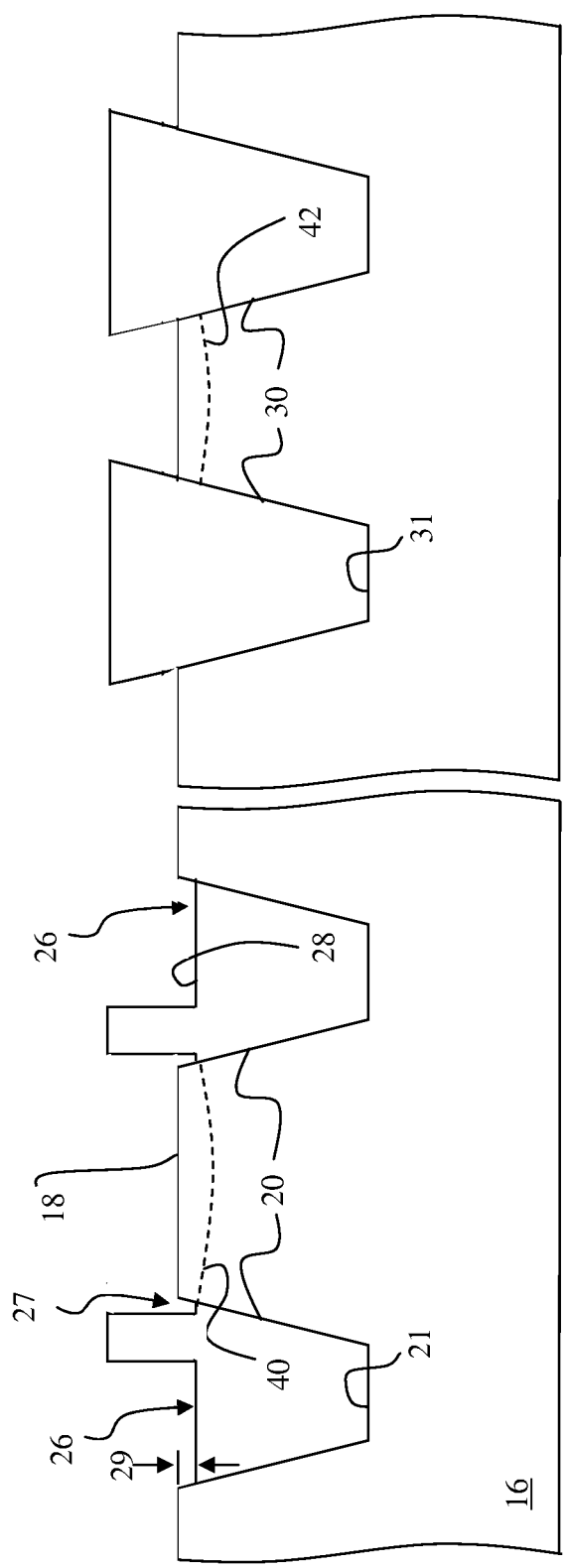
Figure 7:
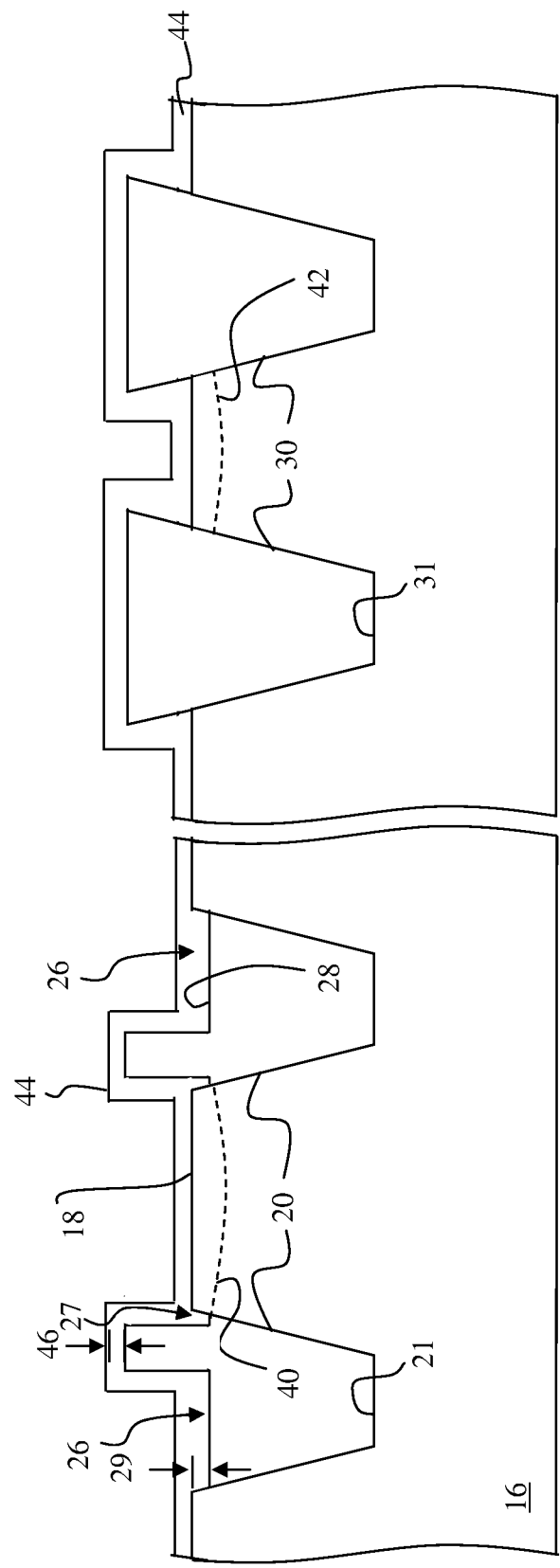

Referring now to FIG. 6, the pad layer 87 and the mask layer 88 are removed from the substrate 16. The removal may be done in a known manner such as wet or dry etching. Next, as shown in FIG. 7, the dielectric layer 44 of thickness suitable for the analog device 12 is deposited on the substrate 16 and isolation structures 20 and 30 using chemical vapor deposition (CVD) in one example. The dielectric layer 44 is HfO2 and is deposited to the thickness 46 in a range of about 20 Å to about 200 Å in one example.

Figure 8:
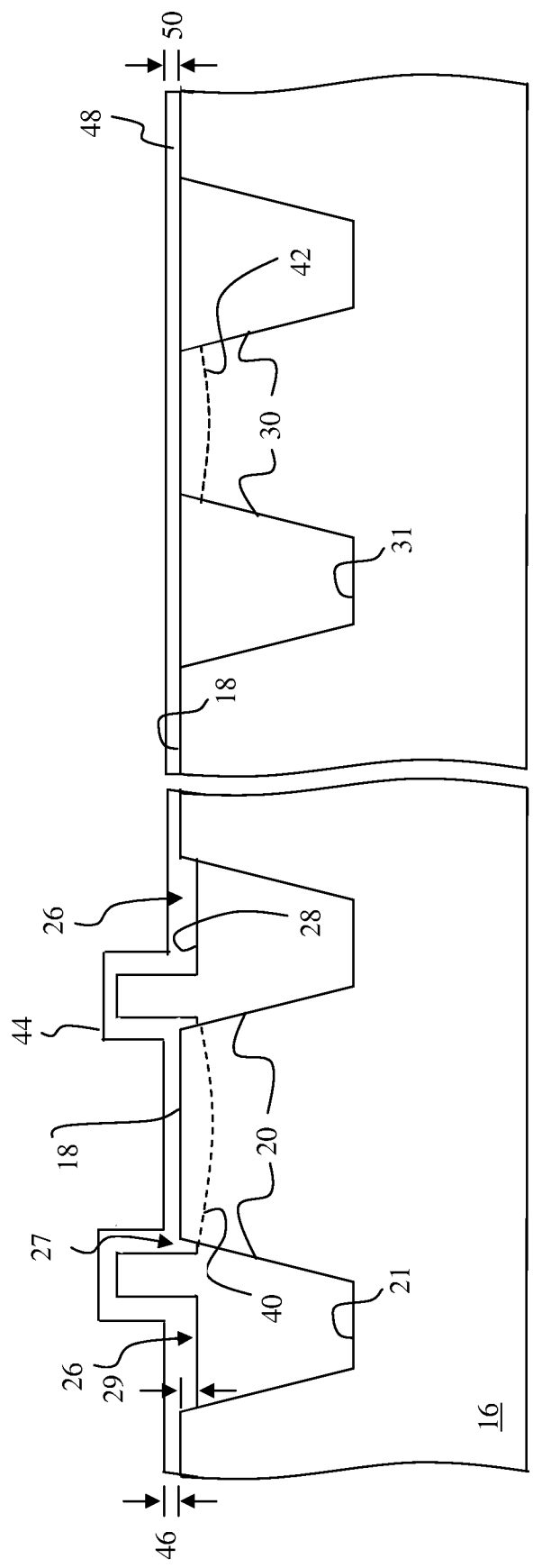

Referring now to FIG. 8, a non-illustrated photoresist mask is formed, and the portion of the dielectric layer 44 disposed over the isolation structure 30 and channel region 42 is removed using known methods. During the removal, the portion of the isolation structure 30 extending above the substrate surface 18 is removed as well. Thus, after the removal, a step height between the isolation structure 30 and the substrate surface 18 is approximately zero. The non-illustrated mask is then removed. Next, the dielectric layer 48 with thickness suitable for the digital device 14 is deposited on the substrate 16 and isolation structure 30 using CVD in one example. The dielectric layer 48 is deposited to the thickness 50 in a range of about 20 Å to about 200 Å.

Figure 9:
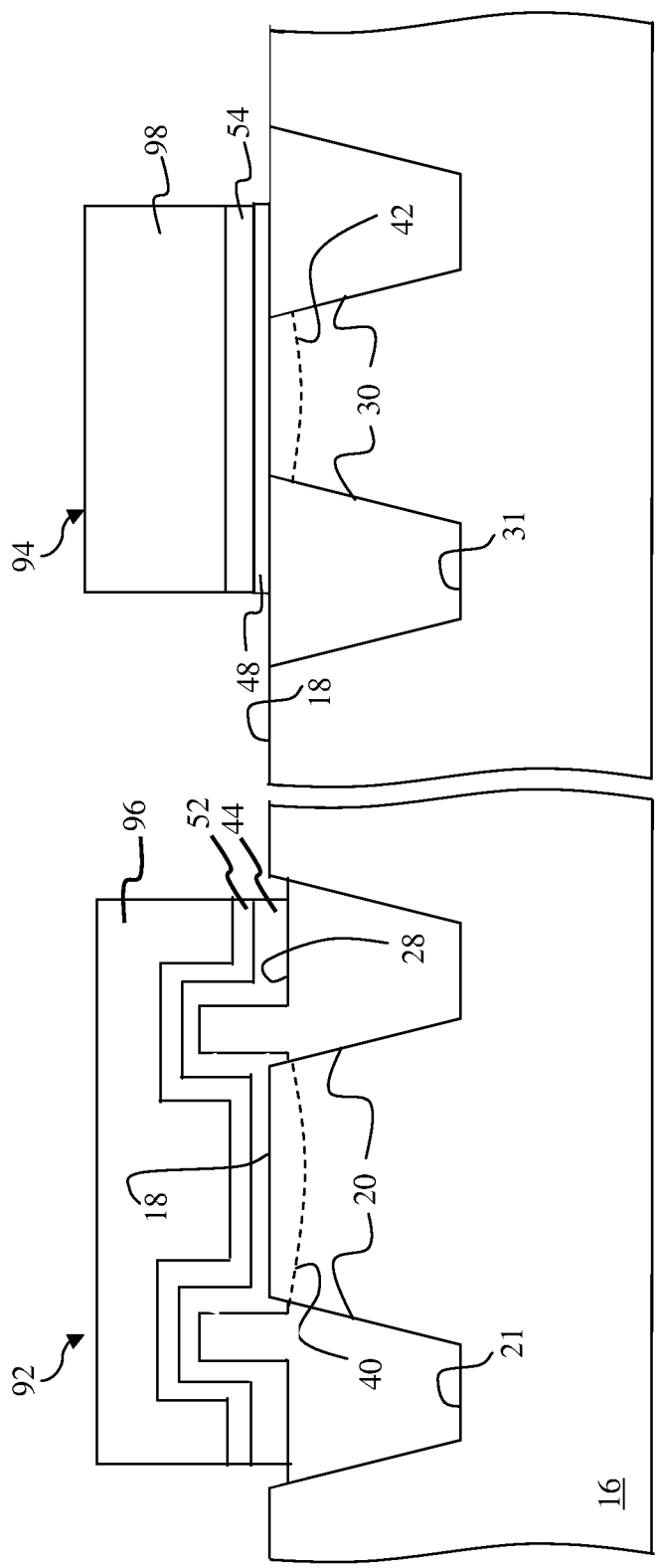

Referring now to FIG. 9, additional layers are deposited and patterned to form temporary gate structures 92 and 94. Specifically, a layer of tantalum nitride is deposited by CVD over the dielectric layers 44 and 48 to form the barrier layers 52 and 54. The barrier layers 52 and 54 are deposited to a thickness of about 10 Å to about 200 Å. A layer of polysilicon is subsequently formed by CVD over the barrier layers 52 and 54 to form dummy gate layers 96 and 98. Alternatively, other comparable materials may be deposited to form the dummy gate layers 96 and 98, and the dummy gate layers 96 and 98 can include multiple material layers. The above-described layers 44, 48, 52, 54, 96, and 98 may each alternatively be formed using any suitable process, such as physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof.

Next, a photolithography process is employed to create the temporary gate structures 92 and 94. The portions of layers 44, 52, and 96 not disposed over the channel region 40 and isolation structure 20 are removed to form temporary gate structure 92. Likewise, the portions of layers 48, 54, and 98 not disposed over the channel region 42 and isolation structure 30 are removed to form temporary gate structure 94. The photolithography patterning process may include any number of suitable steps including photoresist coating (e.g., spin-on coating), soft baking, mask aligning, exposure, post-exposure baking, developing the photoresist, rinsing, drying (e.g., hard baking), other suitable processes, and/or combinations thereof. Further, the photolithography exposing process may be wholly replaced by other proper methods, such as maskless photolithography, electron-beam writing, or ion-beam writing.

Next, the non-illustrated gate spacers 64 and 66 are formed in a known manner along the full length of each side of the temporary gate structures 92 and 94. Silicon nitride, a dielectric material, is deposited on the temporary gate structures 92 and 94 to form the gate spacers 64 and 66 in one example.

Figure 10:
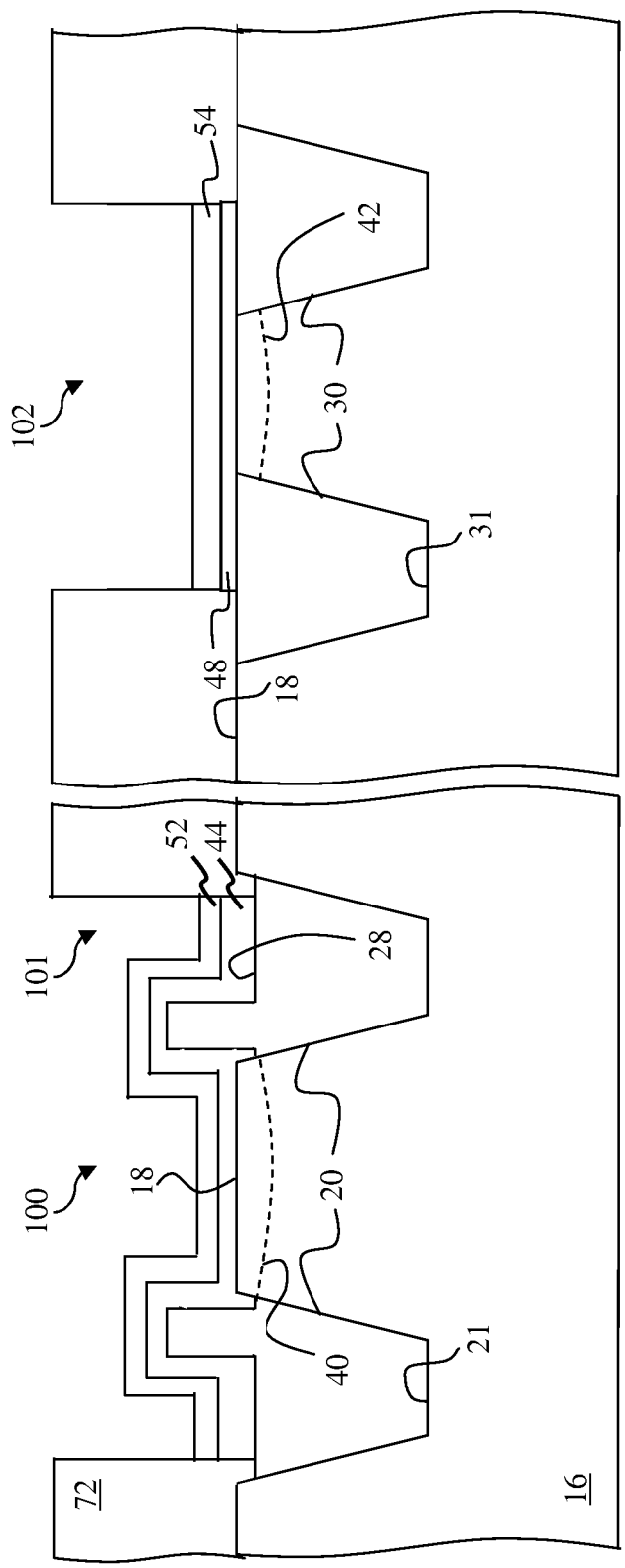

Referring now to FIG. 10, the interlayer (or inter-level) dielectric (ILD) layer 72 is next formed over the substrate 16, and the temporary gate structures 92 and 94. The ILD layer 72 is composed of silicon oxide. Subsequent to the deposition of the ILD layer 72, a chemical mechanical polishing (CMP) process is performed, until a top portion of each temporary gate stack 92 and 94 is exposed.

Figure 11:
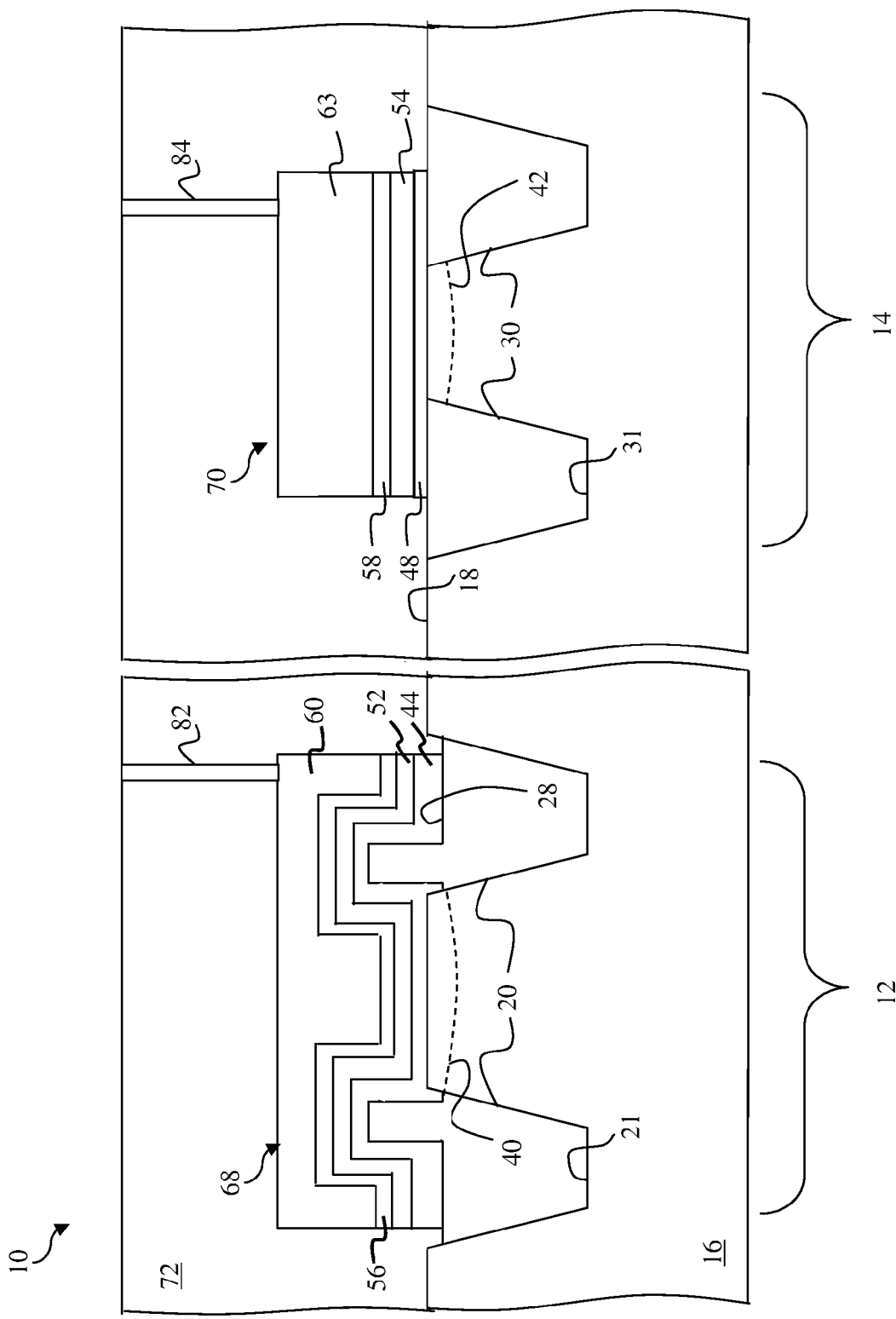

A gate replacement process is next performed, wherein the top layers of the temporary gate structures 92 and 94 are removed and replaced with metal electrodes. In particular, FIG. 11 depicts the devices after the removal of the dummy gate layers 96 and 98 from the temporary gate structures 92 and 94. A non-illustrated photoresist layer is deposited and patterned to facilitate etching that effects the removal. The dummy gate layers 96 and 98 may be removed from the temporary gate structures 92 and 94 simultaneously or independently by any suitable process, such as a dry etching and/or wet etching process. After etching away the layers 96 and 98 and then stripping the photoresist, the barrier layers 52 and 54 respectively define bottom surfaces of openings 100, 101, and 102.

Next, as shown in FIG. 11, the openings 100, 101, and 102 are filled with metal to form gate structures 68 and 70, respectively. Specifically, forming the gate structures 68 and 70 includes forming the work function layers 56 and 58 over the respective barrier layers 52 and 54 and then forming the metal fill layers 60 and 62 over the work function layers 56 and 58. In the present embodiment, the work function layers 56 and 58 are formed by the deposition of titanium nitride to a thickness of about 10 Å to 200 Å, and the metal fill layers 60 and 62 are formed by the deposition of aluminum up to or above the top of the openings 100 and 101, and 102, respectively. The tops of the gate structures 68 and 70 and the ILD layer 72 are then planarized.

Subsequent to the formation of the gate structures 68 and 70, the ILD layer 72 is increased in size in a vertical dimension by the deposition of additional silicon oxide over the gate structures and the previously deposited ILD material.

Next, the source contacts 74 and 78 and drain contacts 76 and 80 (FIG. 1) are formed through the ILD layer 72 to engage source regions 32 and 36 and drain regions 34 and 38, respectively. Specifically, openings are etched through the ILD layer 72 at respective locations over the source and drain regions 32, 36, 34, and 38, exposing portions of these regions. The openings are subsequently filled with copper.

Next, gate contacts 82 and 84 are formed through the ILD layer 72 to engage the gate structures 68 and 70. Specifically, an opening is etched through the ILD layer 72 at a location above the gate structure 68 and over the recess 26. Ideally, the etching process opens a hole exposing only a top portion of the metal fill layer 60. However, it is difficult to control the exact depth of the etch, and a small portion of the metal fill layer 60 may be etched away as well. Accordingly, by etching the opening for the gate contact over the recess 26 where the metal fill layer 60 is thicker, even if a portion of the metal layer 60 is inadvertently removed, it does not impair the operation of the analog device 12. The etched contact opening is subsequently filled with copper. Also, an opening is etched through the ILD layer 72 at a location above the gate structure 70 and over the isolation structure 30. The opening is filled with copper to contact the exposed metal fill layer 62. The above contact formation processes may include photolithography, etching, stripping, deposition, and any other appropriate procedures. Lastly, a CMP process is performed to planarize the top portions of the source, drain, and gate contacts 74, 78, 76, 80, 82, and 84, and the ILD layer 72.

Figure 12:
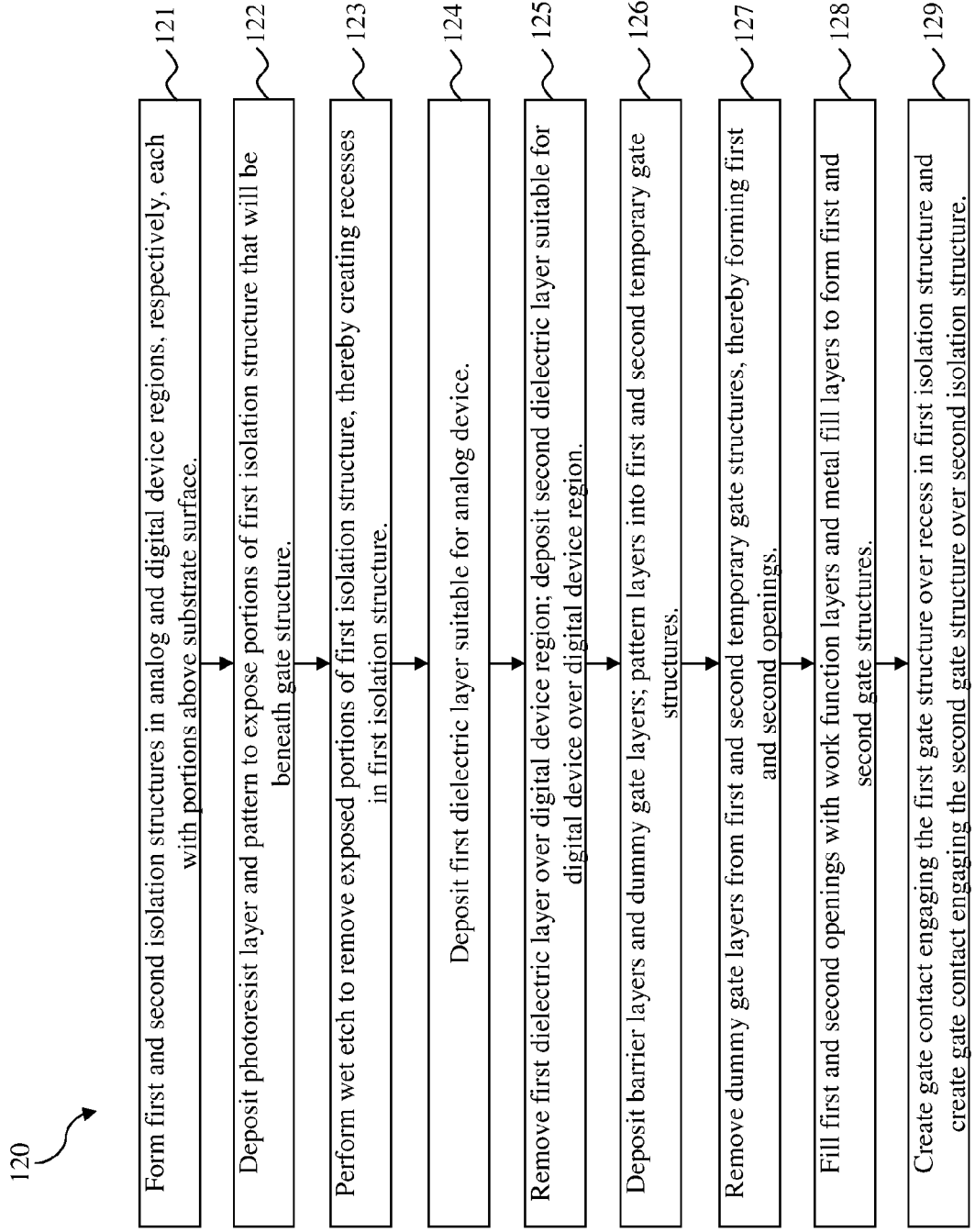
FIG. 12 is a high-level flowchart showing a process that is described in association with FIGS. 3-11.

FIG. 12 is a high-level flowchart showing a process 120 that was described above in association with FIGS. 3-11. Process 120 begins at block 121 where isolation structures 20 and 30 are formed for the analog and digital devices 12 and 14, respectively. Pad layer 87 and mask layer 88 are deposited as part of the formation of the isolation structures 20 and 30. Isolation structures 20 and 30 each have portions both above and below the substrate surface 18. The process 120 proceeds to block 122, where photoresist layer 90 is deposited and patterned to expose portions of the isolation structure 20 that will be beneath the gate structure 68. Next, in block 123, a wet etch is performed to remove exposed portions of the isolation structure 20, thereby creating the recesses 26 and 27 in the isolation structure 20. Also, the mask layer 88 and pad layer 87 used to create the isolation structures 20 and 30 are removed. Process 120 proceeds to block 124, where the dielectric layer 44 is deposited over the substrate 16 and isolation structures 20 and 30. Then, in block 125, a portion of the dielectric layer 44 is removed, which is the portion disposed over the region in which the digital device 14 will be formed. During the removal, the portion of the isolation structure 30 above the substrate surface 18 is removed as well. Also in block 125, the dielectric layer 48 is deposited over the region in which the digital device 14 will be formed. Process 110 proceeds to block 126, where barrier layers 52 and 54 and dummy gate layers 96 and 98 are deposited on the dielectric layers 44 and 48, respectively. The multiple layers are then patterned to form the temporary gate structures 92 and 94. Also, the ILD layer 72 is formed over the substrate and the temporary gate structures. A gate replacement process is then performed over the course of blocks 127 and 128. Specifically, in block 127, the dummy gate layers 96 and 98 are removed from the temporary gate structures 92 and 94, which creates the openings 100 and 102 above the barrier layers 52 and 54. Next, in block 128, the openings 100 and 102 are respectively filled with the work function layers 56 and 58 and the metal fill layers 60 and 63 to form the gate structures 68 and 70. Also, ILD layer 72 is enlarged in a vertical dimension. Finally, process 110 proceeds to block 129, where the gate contact 82 is formed to engage the gate structure 68 at a location over the recess 26 in the isolation structure 20. Also, the gate contact 84 is formed to engage the gate structure 70 at a location over the isolation structure 30.

The semiconductor device 10 is not limited to the aspects of the integrated circuit described above. Moreover, altering the order of the manufacturing steps depicted in FIGS. 3-12 may alter the configuration of the embodiment in FIGS. 1-2. For example, if the thinner dielectric layer 48 for the digital device is deposited on the substrate before the thicker dielectric layer 44, the portion of isolation structure 30 above the substrate surface may not be removed as depicted in FIG. 8. In such a case, there may be a significant step height between the isolation structure 30 and the substrate surface 18 resulting in a reduced thickness of metal fill layer 63. Accordingly, additional manufacturing processes may be performed to form recesses in isolation structure 30 similar to the recesses 26 and 27 in isolation structure 20. Further, the photoresist mask 90 depicted in FIG. 4 may be configured to expose portions of the isolation structure 20 above the substrate surface 18.

Additionally, the integrated circuit in the semiconductor device 10 can further include non-illustrated passive components such as resistors, capacitors, inductors, and/or fuses; and not-illustrated active components, such as MOSFETs including p-channel MOSFETs (pMOS transistors) and n-channel MOSFETs (nMOS transistors), complementary metal-oxide-semiconductor transistors (CMOSs), high voltage transistors, and/or high frequency transistors; other suitable components; and/or combinations thereof.

The present disclosure provides for many different embodiments. One of the broader forms of the present disclosure involves a method of fabricating a semiconductor device. The method includes providing a substrate having an upwardly facing first surface, and having a trench extending downwardly into the substrate from the first surface. The method continues with forming an isolation structure disposed partly in the trench and having an upwardly facing second surface, the isolation structure having two portions that are respectively disposed above and below the first surface, wherein the second surface is vertically higher than the first surface by a first step height. A top portion of the isolation structure is removed to form a recess therein having an upwardly facing bottom surface disposed below the first surface. Next, the method continues with forming a gate structure over the substrate and the recess, and forming a gate contact engaging the gate structure over the recess. In one aspect, removing the exposed portion of the isolation structure forms a first recess and a second recess therein, each recess having an upwardly facing bottom surface lower than the first surface. The first and second recesses are set apart by an isolation wall having a third step height larger than the first step height. The first recess may be adjacent to a channel region of the substrate and to the first surface of the substrate, and forming the gate contact includes configuring a conductive material to engage the metal in the portion of the opening over the second recess.

Another of the broader forms of the present disclosure involves another method of fabricating a semiconductor device. The method includes providing a substrate having an upwardly facing first surface, having first and second regions, and having first and second trenches extending downwardly into the substrate from the first surface, wherein the first and second trenches are located in the first and second regions, respectively. The method continues with forming first and second isolation structures disposed partly in the first and second trenches, respectively, and having respective upwardly facing second and third surfaces higher than the first surface, the isolation structures each having portions respectively disposed above and below the first surface, wherein the second and third surfaces are vertically higher than the first surface by a first step height. A top portion of the first isolation structure is removed to form a recess therein having an upwardly facing bottom surface disposed below the first surface, wherein the bottom surface and the first surface are spaced vertically by a second step height smaller than the first step height. Next, the method continues with depositing a first dielectric layer having a first thickness over the first and second regions; removing the first dielectric layer over the second region and removing a portion of the second isolation structure above the first surface such that the first surface and the third surface are approximately coplanar; depositing a second dielectric layer having a second thickness smaller than the first thickness over the second region and the second isolation region; forming first and second gate structures on the first and second dielectric layers, respectively, the first gate structure being over the first region and the recess, and the second gate structure being over the second region and the second isolation structure; and forming first and second gate contacts, the first gate contact engaging the first gate structure over the recess, and the second gate contact engaging the second gate structure Yet another of the broader forms of the present disclosure involves a semiconductor device. The semiconductor device includes a substrate having an upwardly facing first surface, and having a trench extending downwardly into the substrate from the first surface. The device further includes an isolation structure disposed partly in the trench and having an upwardly facing second surface higher than the first surface, the isolation structure having two portions respectively disposed above and below the first surface, wherein the second surface is vertically higher than the first surface by a first step height, and wherein the isolation structure has a recess extending downwardly from the second surface, the recess having an upwardly facing bottom surface disposed below the first surface. A gate structure is disposed over the substrate and the recess, and a gate contact engages the gate structure over the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduce herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising:
   providing a substrate having an upwardly facing first surface, and having a trench extending downwardly into the substrate from the first surface;
   forming an isolation structure disposed partly in the trench and having an upwardly facing second surface, the isolation structure having two portions that are respectively disposed above and below the first surface, wherein the second surface is vertically higher than the first surface by a first step height;
   removing a top portion of the isolation structure to form a recess therein having an upwardly facing bottom surface disposed below the first surface;
   forming a gate structure over the substrate and the recess; and
   forming a gate contact engaging the gate structure over the recess.

2. The method according to claim 1, wherein the bottom surface and the first surface are spaced vertically by a second step height smaller than the first step height.

3. The method according to claim 1, wherein removing the top portion of the isolation structure forms a first recess and a second recess therein, each recess having an upwardly facing bottom surface lower than the first surface.

4. The method according to claim 1, wherein the first and second recesses are set apart by an isolation wall having a step height larger than the first step height.

5. The method according to claim 4,
   wherein the first recess is adjacent to a channel region of the substrate and the first surface of the substrate; and
   wherein forming the gate contact includes configuring a conductive material to engage the metal in the portion of the opening over the second recess.

6. The method according to claim 1, wherein forming the gate structure includes:
   forming a dummy gate electrode;

forming gate spacers on each side of the dummy gate electrode;

removing the dummy gate electrode to create an opening between the gate spacers; and filling the opening with metal.

7. The method according to claim 6, wherein filling the opening with metal includes depositing a work function metal into the opening and depositing a fill metal into the opening.

8. The method according to claim 1, further comprising:

depositing a mask on the substrate, patterning the mask, and etching the trench into the substrate; and wherein forming the isolation structure includes filling the trench with a dielectric material, and planarizing the dielectric material to be coplanar with the mask.

9. The method according to claim 8, further comprising removing the mask after or before removing the top portion of the isolation structure.

10. The method according to claim 1, wherein removing includes forming a protective layer over portions of the substrate and the isolation structure that will be free of the gate structure, performing a wet etch to remove the portions of the isolation structure that will be free of the gate structure, and removing the protective layer.

11. The method according to claim 10, wherein performing the wet etch is carried out with a hydrogen fluoride (HF) solution, wherein the HF solution has a ratio of HF to water in a range of 50:1 to 100:1; and wherein performing the wet etch is carried out for 50 to 75 seconds.

12. A method of fabricating a semiconductor device, the method comprising:

providing a substrate having an upwardly facing first surface, having first and second regions, and having first and second trenches extending downwardly into the substrate from the first surface, wherein the first and second trenches are located in the first and second regions, respectively;

forming first and second isolation structures disposed partly in the first and second trenches, respectively, and having respective upwardly facing second and third surfaces higher than the first surface, the isolation structures each having portions respectively disposed above and below the first surface, wherein the second and third surfaces are vertically higher than the first surface by a first step height;

removing a top portion of the first isolation structure to form a recess therein having an upwardly facing bottom surface disposed below the first surface, wherein the bottom surface and the first surface are spaced vertically by a second step height smaller than the first step height;

depositing a first dielectric layer having a first thickness over the first and second regions;

removing the first dielectric layer over the second region and removing a portion of the second isolation structure above the first surface such that the first surface and the third surface are approximately coplanar;

depositing a second dielectric layer having a second thickness smaller than the first thickness over the second region and the second isolation region;

forming first and second gate structures on the first and second dielectric layers, respectively, the first gate structure being over the first region and the recess, and the second gate structure being over the second region and the second isolation structure; and forming first and second gate contacts, the first gate contact engaging the first gate structure over the recess, and the second gate contact engaging the second gate structure.

13. The method according to claim 12, wherein removing the top portion of the first isolation structure forms a first recess and a second recess therein, the first and second recesses being set apart by an isolation wall having a third step height larger than the first step height, and each recess having an upwardly facing bottom surface lower than the first surface.

\* \* \* \* \*